(12) United States Patent
Magnus et al.

(10) Patent No.: US 7,042,004 B2
(45) Date of Patent: May 9, 2006

(54) METHOD OF FORMING QUANTUM-MECHANICAL MEMORY AND COMPUTATIONAL DEVICES AND DEVICES OBTAINED THEREOF

(75) Inventors: Wim Magnus, Waver (BE); Christoph Kerner, Overijse (BE); Wim Schoenmaker, Genk (BE)

(73) Assignees: Interuniversitair Microelektronica Centrum (IMEC), Leuven (BE); Katholieke Universiteit Leuven, Leuven (BE)

( * ) Notice: Subject to any disclaimer, the term of this patent is extended or adjusted under 35 U.S.C. 154(b) by 109 days.

(21) Appl. No.: 10/601,321

(22) Filed: Jun. 20, 2003

(65) Prior Publication Data

US 2004/0071019 A1    Apr. 15, 2004

Related U.S. Application Data

(60) Provisional application No. 60/390,883, filed on Jun. 21, 2002.

(51) Int. Cl.
    *H01L 29/06*    (2006.01)
(52) U.S. Cl. .......................... 257/31; 505/162; 341/200
(58) Field of Classification Search .................. 257/31, 257/661; 505/162, 171; 341/200
    See application file for complete search history.

(56) References Cited

U.S. PATENT DOCUMENTS

| | | | | |
|---|---|---|---|---|
| 5,051,787 A | * | 9/1991 | Hasegawa | ..................... 257/34 |
| 5,463,518 A | * | 10/1995 | Otomo et al. | ................ 505/171 |
| 6,563,311 B1 | * | 5/2003 | Zagoskin | ..................... 324/248 |
| 6,885,325 B1 | * | 4/2005 | Omelyanchouk et al. | ... 341/133 |
| 2002/0121636 A1 | * | 9/2002 | Amin et al. | ................... 257/9 |
| 2002/0177529 A1 | * | 11/2002 | Ustinov | ....................... 505/100 |
| 2002/0180006 A1 | * | 12/2002 | Franz et al. | ................ 257/661 |

FOREIGN PATENT DOCUMENTS

WO    WO 00/30255    5/2000

OTHER PUBLICATIONS

S. Das Sarma et al., "Theoretical Perspectives on Spintronics and Spin-Polarized Transport", arXiv:condensed-matter, vol. 1, Feb. 16, 2000, pp. 100-105.*

(Continued)

*Primary Examiner*—W. David Coleman
(74) *Attorney, Agent, or Firm*—Knobbe Martens Olson & Bear LLP

(57) ABSTRACT

The present invention discloses a quantum system comprising computational elements, consisting of an insulated ring of superconductive material, and semi-closed rings, which are used as an interface or input/output facility between the quantum bit and the external world. Faraday induction is used to provide electromagnetic coupling between adjacent computational elements and between the computational elements with interface elements of the quantum system. Therefore the corresponding magnetic flux acts as an information carrier. Ferromagnetic cores are used to improve the magnetic coupling between adjacent elements of the quantum system.

40 Claims, 14 Drawing Sheets

OTHER PUBLICATIONS

Hiro Akinaga et al., "Semiconductor Spintronics", IEEE Transactions on Nanotechnology, vol. 1, Mar. 1, 2002, pp. 19-31.*

C. Kerner et al., "Metal rings as quantum bits", ESSDERC 2002, Proceedings of the 32nd European Solid-State Device Research Conference; Editors: Baccarani, G.; Bologna, Italy, 2002, pp. 615-618.*

Lorke, et al., "Spectroscopy of Nanoscopic Semiconductor Rings" Phys. Rev. Lett. 84, located at http://focus.aps.org/story/v5/st9//author. (Mar. 6, 2000).

Shor, Peter, W., "Algorithms for Quantum Computation: Discrete Logarithms and Factoring", in IEEE Proc. 35th Annual Symposium on the Foundation of Computer Science, pp. 124-134, (1994).

* cited by examiner

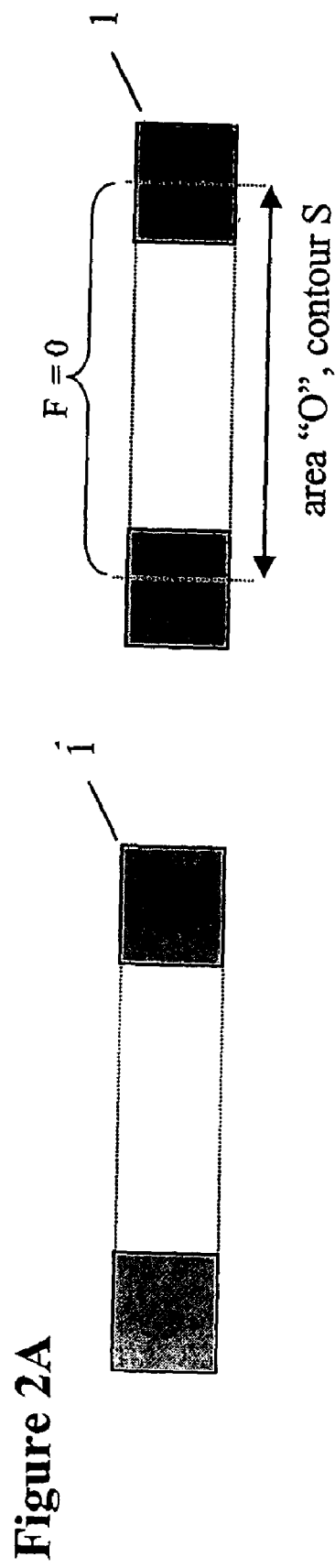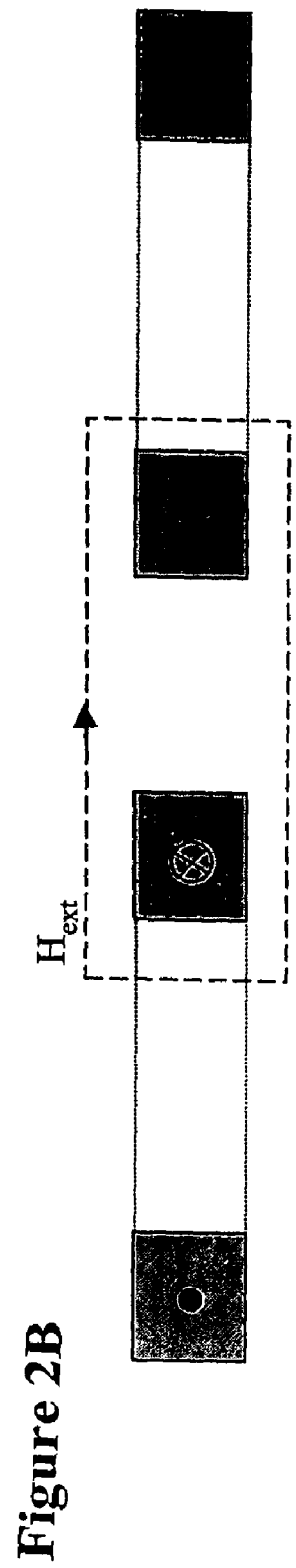
Figure 2A
Figure 2B

10

5a,11   6a,11   10

5a,11   6a,11   12
                 10

METHOD OF FORMING QUANTUM-MECHANICAL MEMORY AND COMPUTATIONAL DEVICES AND DEVICES OBTAINED THEREOF

RELATED APPLICATIONS

This application claims priority to, and hereby incorporates by reference in its entirety, U.S. provisional application No. 60/390,883, filed Jun. 21, 2002, now abandoned and entitled "METHOD FOR FORMING QUANTUM-MECHANICAL MEMORY AND COMPUTATIONAL DEVICES AND DEVICES OBTAINED THEREOF."

BACKGROUND OF THE INVENTION

1. Field of the Invention

The present invention relates to memory and computational devices based on quantum-mechanical interaction between individual bits. More particularly the present invention relates to solid-state devices comprising a ring structure as basic element for storing a single bit of information.

2. Description of the Related Art

During the last decade, quantum computing has become a topic of ever growing interest, particularly in the field of cryptography applications, based on Shor's algorithm for factoring large integers as disclosed by P. W. Shor in "Algorithms for quantum computing: discrete logarithms and factoring" in Proc. 35$^{th}$ Annual symposium on the foundations of computer science, 1994, pp124–123, which is incorporated herein in its entirety by reference. This is due to the fact that the quantum-mechanical superposition principle allows for a level of parallel computing that exceeds all classical methods in this field.

A characteristic that differentiates quantum computing from classical computing is the entanglement of the bits. Also in classical computing devices operating at atomic scale is being developed. Although these "quantum devices" use discrete charge quanta the value of each bit is well defined: either a "0" or a "1". In quantum computing however the interference between subsequent bits may bring the system in entangled multibit states, which are not accessible in classical computing.

All implementations of such a quantum computer starts with the design of an individual unit of information processing, the so-called quantum bit or "qbit".

A first series of approaches addresses the design of this quantum bit at atomic level. The single qbit is realized e.g. as a spinning electron, an atomic nucleus or an oscillating molecule. Whereas these approaches directly address the quantum scale, they lack the connection of the qbit to the outside world: input/output structures (I/) ports are not easily available. PCT International Publication No. WO 00/30255, entitled "Crystal Lattice Quantum Computer", published on May 25, 2002, which is incorporated herein in its entirety by reference, shows a crystal lattice computer where the qbit is associated with the orientation of the nuclear spin of the atoms.

A second series of similar approaches forms quantum systems but on a larger, nano- or mesoscopic, scale such as quantum dots, nanometer-sized rings or quantum wires. Although these devices are larger than the devices of the first approach, they operate similarly as if these devices where "artificial or macro-atoms". Quantum dots are microscopic, carefully tailored regions of a semiconductor surface in which the number of electrons is precisely controlled. Axel Lorke et al. discloses in "Spectroscopy of nanoscopic semiconductor rings", Phys. Rev Letter 84, March 2000, which is incorporated herein in its entirety by reference, the manufacturing of an array of semiconductor quantum rings starting from InAs droplets formed on a GaAs surface. The minute rings allow one or two electrons to circulate in coherent quantum states corresponding to one of the values of a bit. These quantum states are dependent on the applied large external magnetic field of about 8 Tesla, as was shown by externally providing energy in the form of infrared radiation having the appropriate wavelength to allow transitions between these magnetic-field-dependant quantum states. This external magnetic field is applied uniform over the nanoscopic ring as the rings are positioned in-between two parallel plates. Although the authors succeeded in forming qbits on an above-atomic scale, no mention of I/O ports is indicated and the proposed device are for research purpose only, without giving any information about integration, even of a single qbit, in a CMOS (complementary Metal Oxide Semiconductor) compatible technology.

BRIEF DESCRIPTION OF THE DRAWINGS

All drawings are intended to illustrate some aspects and embodiments of the present invention. Devices and fabrication steps are depicted in a simplified way for reason of clarity. Not all alternatives and options are shown and therefore the invention is not limited to the content of the given drawings.

FIGS. 2A, 2B, 2C, 2D, and 2E illustrate the switching of the quantum state of a computational element in accordance with the present invention.

SUMMARY OF THE INVENTION

Figure 1A:
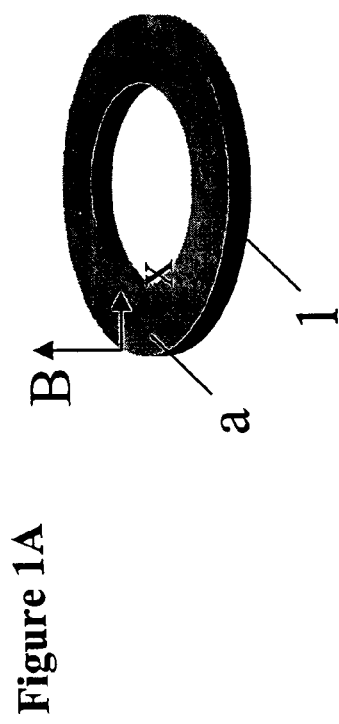
FIG. 1A illustrates a single closed ring of a quantum system according to the present invention.

A first object of the invention is to offer a quantum device for handling and/or storing bits having a well-defined two-dimensional mathematical basis.

Another object of the invention is to offer a quantum computational or memory device comprising I/O facilities, which do not affect, during or before read-out of bits, the quantum states of the individual bits to the extent that information is lost. This device further allows a reproducible preparation of the initial state of the qbit after read-out.

Another object of the invention is to offer a quantum computational or memory device having coherence times that are longer than the computation times.

Another object of the invention is to offer a method for forming quantum computational or memory devices in a reproducible and scalable fashion allowing the implementation of these devices on a chip. This method further allows the formation of I/O ports connecting the qbit to the peripheral circuitry of such chip or to the external world. Preferably the quantum device can be integrated in a semiconductor substrate, using semiconductor-processing techniques.

These objectives are met in the present invention by proposing a superconducting quantum ring as a computational or datastoring element. More specifically this quantum bit or qbit state of such a quantum ring is related to the absence or presence of persistent currents to be generated by means of a magnetic field.

Coupling between the quantum rings in a matrix and between these quantum rings and these input-output structures is established by induced magnetic fields generated by the currents flowing in the quantum rings and in the input-output structures. The quantum rings are closed structures in which a closed current flow path is possible. The current flowing along such closed current flow path will create a magnetic field. The quantum ring is a topological space of genus 1. The quantum ring is a closed structure only having one hole. Preferably the quantum rings have a circular cross-section. Preferably the quantum ring has rounded corners. Preferably the quantum rings have a torus or doughnut-like shape also known as toroid. The input-output structures are discontinuous, semi-closed or open rings having two terminals, which can be connected to a power source. The current flowing from this power source along a semi-closed path in the input structure will create a magnetic field as well. The current flowing through one element, e.g. I/O element, qbit, will create a magnetic field, which will induce a current in another element, which encloses the field lines of this induced magnetic field and as such this subsequent element is magnetically coupled to the previous element.

In one embodiment, the invention provides a device comprising at least two computational elements, each computational element being shaped as a ring-like structure. Each computational element is magnetically coupled to at least one adjacent computational element. The device further comprises an interface structure configured to provide magnetic access to the computational elements.

In another embodiment, the invention provides a method of forming a device comprising at least two computational elements. The method comprises depositing on a substrate a superconductive material. The method further comprises patterning said superconductive material to form the at least two computational elements and at least one input-output element. The method further comprises depositing an insulating layer on at least a portion of said patterned computational elements and said patterned input-output element. In yet another embodiment, the invention provides a method of performing a quantum computation. The method comprises applying a magnetic pulse to a computational element. The method further comprises causing a change in the conductive state of said computational element from superconducting to ohmic conduction, the change being responsive to applying the magnetic pulse.

DETAILED DESCRIPTION OF THE PREFERRED EMBODIMENT

In relation to the appended drawings the present invention is described in detail in the sequel. It is apparent however that a person skilled in the art can imagine several other equivalent embodiments or other ways of executing the present invention, the spirit and scope of the present invention being limited only by the terms of the appended claims.

In a first aspect the quantization of the information in the quantum bit is disclosed. The quantization of the information in the structure according to the present invention is obtained by using superconducting rings to trap multiples of the magnetic flux quantum in order to maintain persistent currents within the qbit. These flux quanta corresponds to clearly distinct and discrete energy levels.

Deep inside of a superconducting material, no magnetic field will be present. If an external magnetic field were to be applied to such superconducting structure this external field would be pushed outwards of the structure. Such perfect diamagnetism is an inherent property of superconductivity and is called the Meissner-effect. Because of the Meissner-effect the external magnetic field will decay exponentially to zero towards the bulk of superconducting structure. This reduction in magnetic field requires the presence of a superconducting current flowing at the outer and/or inner surface of the superconductor structure, the induced field of which cancels the external field inside the superconductor. Apart from the transition region near the surface the magnetic field and the current density inside the superconducting structure will therefore be zero. The surface currents of the structure will adjust themselves if the external magnetic field is changed. The depth of the transition region is characterized by the so-called London-penetration depth $\lambda_L$ as shown in the following expression for bulk materials at 0 Kelvin, whereby q is twice the electron charge, M is effective mass of a Cooper pair which is twice the effective mass of an electron, $\mu_0$ is the permeability of the bulk material, $n_s$ is the density of Cooper pairs which is function of temperature T and magnetic field H:

$$\lambda_L \approx \frac{1}{q}\sqrt{\frac{M}{\mu_0 n_s}} \qquad (1)$$

The London-penetration depth $\lambda_L$ is a characteristic of the superconducting material: in case of Aluminum $\lambda_L$ is about 16 nm at 0 Kelvin. In order to have a complete Meissner effect at all surfaces, the outer surface of the superconducting structure must have a minimal spacing in-between so that the transition regions of each surface will not overlap. Preferably the minimal spacing is much larger than the London-penetration depth at a given temperature.

For a ring shaped superconducting structure (1), as shown in FIG. 1A, one can calculate the magnetic flux going through the ring given the fact that the current and the magnetic inside this ring (1) is zero due to the Meissner effect. Using Ginzburg-London theory it follows that the current density J in the ring is given by $$\vec{J} = \frac{-n_s q}{M}\left(\hbar \vec{\nabla} \theta + q\vec{A}\right) \qquad (2)$$

with n being the electron concentration, q twice the electron charge, M the effective mass of a Cooper pair, reduced Planck's constant, A the vector potential and θ the quantum mechanical phase. Since the current density J has to be zero inside the ring, one concludes:

$$\vec{\nabla}\theta = -q\vec{A} \qquad (3)$$

Taking the integral along a closed contour "C" inside the ring and using Stokes's theorem to convert a line integral along a contour "C" into a surface integral over the area "O" enclosed by this contour "C", one can shown that the magnetic flux Φ through this area "O" is equal to $$\Phi = s\Phi_0 \text{ where } \Phi_0 = \left(\frac{2\pi\hbar}{q}\right) \quad (4)$$

with s being an integer.

Formula 4 shows that magnetic flux Φ through the ring can only be an integer multiple of the elementary flux quantum $\Phi_0$, which is equal to 2.067810 $10^{-15}$ Weber.

For a given external field the superconducting current flowing at the surface of the ring will be such that the total flux through the ring meets the requirement of equation (4): the sum of the magnetic flux from an external magnetic field and the magnetic flux induced by the superconducting current, will always be a multiple of the elementary flux quantum $\Phi_0$.

The present invention uses the quantization of magnetic flux through a superconducting structure (1) to create a qbit. By using superconductive materials, e.g. preferably Type I superconductors such as Alumium, Nobium, Lead, Tantalum to create a closed loop structure or torus (1) as shown in FIG. 1A, the resulting superconducting structure (1) can trap multiples of the so-called elementary or London flux quantum by having a corresponding amount of superconducting current flowing in the ring (1). The logic states of the qbit, e.g. |0> state, |1> states now correspond to a certain magnetic flux quantum which is related to the absence or presence of a certain amount of current flowing in the ring. The quantization is not a result from a shrinking of the dimensions of the structure. Superconducting rings can sustain persistent currents also at larger dimensions. Typically the rings according to the present invention have a diameter larger than 70 nm even within the micrometer range, while superconducting rings have been manufactured having dimensions in the centimeter range. Hence this present invention alleviates the need for very small rings and simplifies the production of qbit structures. Processing techniques already available in semiconductor processes which allow the manufacturing and integrating of quantum bits in semiconductor chips as will be shown later on. This way the superconducting rings offer a better approach for integrating quantum bit devices with peripheral circuitry, which can be CMOS-based circuitry, while still offering the occurrence of quantum-like behavior. The present invention allows the manufacturing and integrating of quantum bits in semiconductor chips. Although the basic computational element is described as a ring the invention is not limited hereto. More generally one could describe this element (1) as a torus or as a topological space of genus 1; it is closed loop structure having one and only one hole in it. The structure itself can have various shapes: circular, elliptical, and polygonal. Preferably the structure has rounded corners. The diameter of the ring is preferably in the range of 1 to 150 micrometer, while the thickness, i.e. the difference between inner and outer diameter, of the ring would preferably in the range of 1 to 40 micrometer, preferably 1 to 20 micrometer. The minimum height of the ring is preferably 0.3 micrometer.

A superconductive material will loose its superconducting property once the temperature T exceeds a critical temperature $T_c$. A temperature increase in a superconductor can be caused by external events, e.g. heating, radiation, but also by internal events such as heat dissipation or energy losses within the superconductor due to normal currents, e.g. when switching the quantum states or by eddy currents in the core coupling two elements (1,2,3). Even if the temperature is below this critical temperature superconductivity will break down if he external magnetic field H is above a critical magnetic field $H_c$ or, for a given material, the corresponding magnetic inductance $B_c$. Aluminum for example is a superconductive material having a critical temperature $T_c$ of about 1.23 Kelvin and, below this critical temperature, a critical magnetic inductance $B_c$ of about 10 milliTesla. Both the critical magnetic field $H_c$ and the critical temperature $T_c$ are material dependent. Preferably materials are used having a transition or critical temperature above 1 Kelvin. The superconducting state of a conductor is also characterized by the "coherence length" which is a measure for the stability of the superconducting region or spatial coherence between electrons in a superconducting phase. The coherence length $\xi_0$ of Aluminum is about 1.6 micrometer.

Thus if the magnetic field H in a superconductor exceeds the critical value $H_c$ of this superconductor the conductor will loose its superconducting state. A magnetic field can originate from an external source or can be induced by the superconducting current itself. If the superconducting current density increases due to a time-dependent electric field circulating in the ring, it will exceed a critical value $J_c$, corresponding to an induced critical value $H_c$. Then the ring switches to the normal state and ohmic dissipation sets in, while the magnetic field inside the ring increases. The superconducting state of the ring is lost. This property is used to switch the quantum state of the qbit (1). By applying an external magnetic field the superconductor current flowing at the inner and/or outer side of the ring (1) will increase to compensate this external magnetic field. Finally the current density can be increased above the critical current density $J_c$. At this moment the conductor looses its superconducting state and a normal i.e. not-superconducting, current will flow through the ring. This normal current can transfer part of its kinetic energy to the crystal lattice of the conductor resulting in a decrease of the current density below the critical value $J_c$. The component of the total flux through the ring, which is in the direction of the external field, will increase as the component generated by the current through the ring is decreased. The ring can lower its total energy by becoming superconducting again, be it that the magnetic flux corresponding to the new current density will differ from the original flux. The superconducting current required to maintain the new quantum of magnetic flux is now below the critical current density by one flux quantum. Applying an input flux thus changes the quantum state of a qbit, which result in a current exceeding the critical current density. Preferably only the intended magnetic field should affect the operation of the qbit and the quantum system should be shielded from other, unwanted magnetic fields.

Figure 2C:
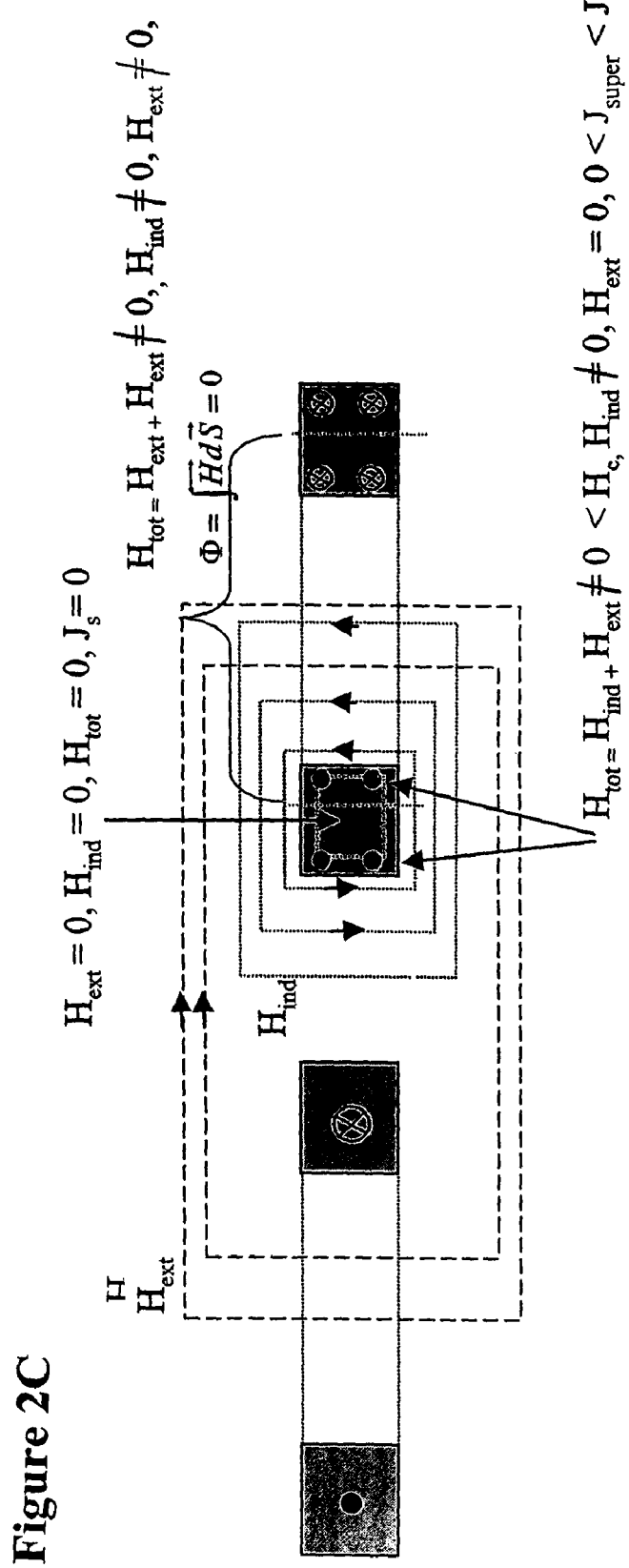

This mechanism is schematically illustrated in FIGS. 2A–e, for the case of two adjacent computational elements (1), however the mechanism is also applied in the case an input (2) element adjacent to a computational element (1) or a computational element (1) adjacent to an output (3) element. In these FIGS. 2A–e not only these elements will be shown which are relevant to explain the mechanism of changing quantum state. FIG. 2A shows a vertical cross-section through the two rings (1), while the core (7) is not shown. In this example no current is flowing and no magnetic field is present. The absence of the magnetic field is indicated by stating that the flux through the opening in the right element is zero: $\Phi=0$. A time-dependent magnetic field $H_{ext}$ is applied to the ring on the right, as is indicated in FIG. 2B by the dashed counter line corresponding to the magnetic field lines. This applied field is, in this example, labelled the external magnetic field to distinguish it from the magnetic field generated by the superconducting current in the right ring. The latter field will be labeled the induced magnetic field $H_{ind}$. The external magnetic field results from a time dependent electrical field, e.g. a current flowing in the ring on the left: if this ring as an input ring (2) then this current is applied from the circuitry surrounding the quantum system, if this ring is a computational element (1) this current is the persistent superconducting current flowing in this closed ring (1). In the ring on the left this current is indicated by a black dot on the right (current flowing into the page) and a crossed circle on the right (current coming out of the page), corresponding to the direction in which the current flows. Due the Meissner effect the total magnetic field $H_{tot}$ inside the superconducting right ring must be zero: the external magnetic field $H_{ext}$ is compensated inside the superconducting right ring by an induced magnetic field $H_{ind}$. Within a distance from the border of the ring, characterized by the London penetration depth $\lambda_L$, the total magnetic field $H_{tot}$ will not be zero but, as explained above decay in an exponential way. The field lines of the induced magnetic field are indicated only on the left part of the ring on the right. This induced magnetic field is generated by a superconducting current, which will flow at the inner and outer surfaces of the right ring as indicated by the black dots at the left and by the crossed circles at the right of this ring.

Figure 2D:
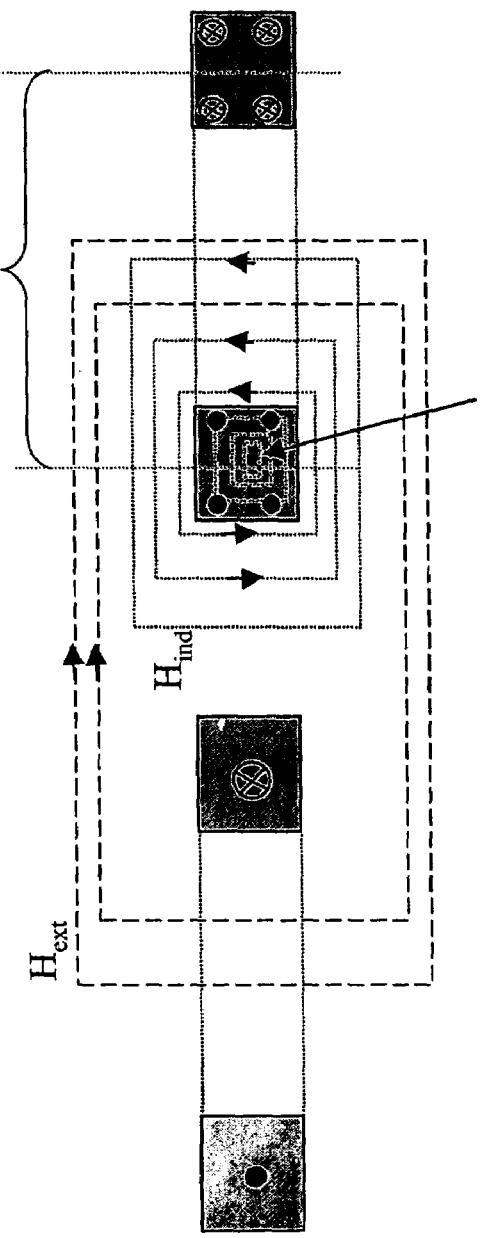
Figure 2E:
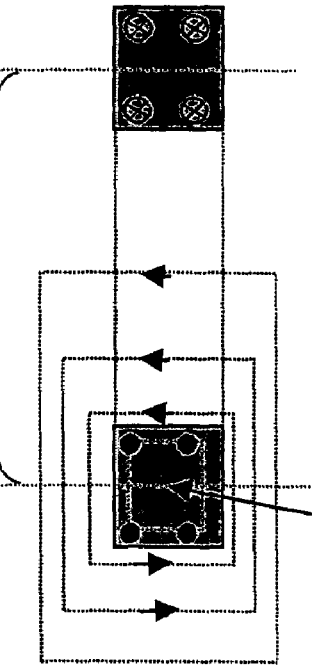
Figure 2E:

As shown in FIG. 2D the total magnetic field $H_{tot}$ near the borders of the right ring will exceed the critical magnetic field $H_c$ and the current density J of the superconducting current in the right ring exceeds a critical current density $J_c$, whereby the conductor looses its superconducting state and a normal i.e. not-superconducting or ohmic, current will flow through the ring. The magnetic field lines will impinge on the ring and penetrate not only near the border but also over the whole of the ring. The electrons will not be part of a Cooper pair and they will loose their kinetic energy by dissipation. Consequently the current density, which is function of the speed of the electrons, decreases below the critical current density $J_c$ and the right ring becomes superconducting again. Contrary to the initial state shown in FIG. 2A there are field lines present within the core of the right ring as shown in FIG. 2E. Because the right ring is superconducting again the Meissner effect comes in to play: within the superconducting right ring a persistent current will remain which will cancel the magnetic field inside this ring, but this persistent current will be such that the flux through the hole is a integer multiple of the quantum flux, expressed in equation 4.

Figure 2F:
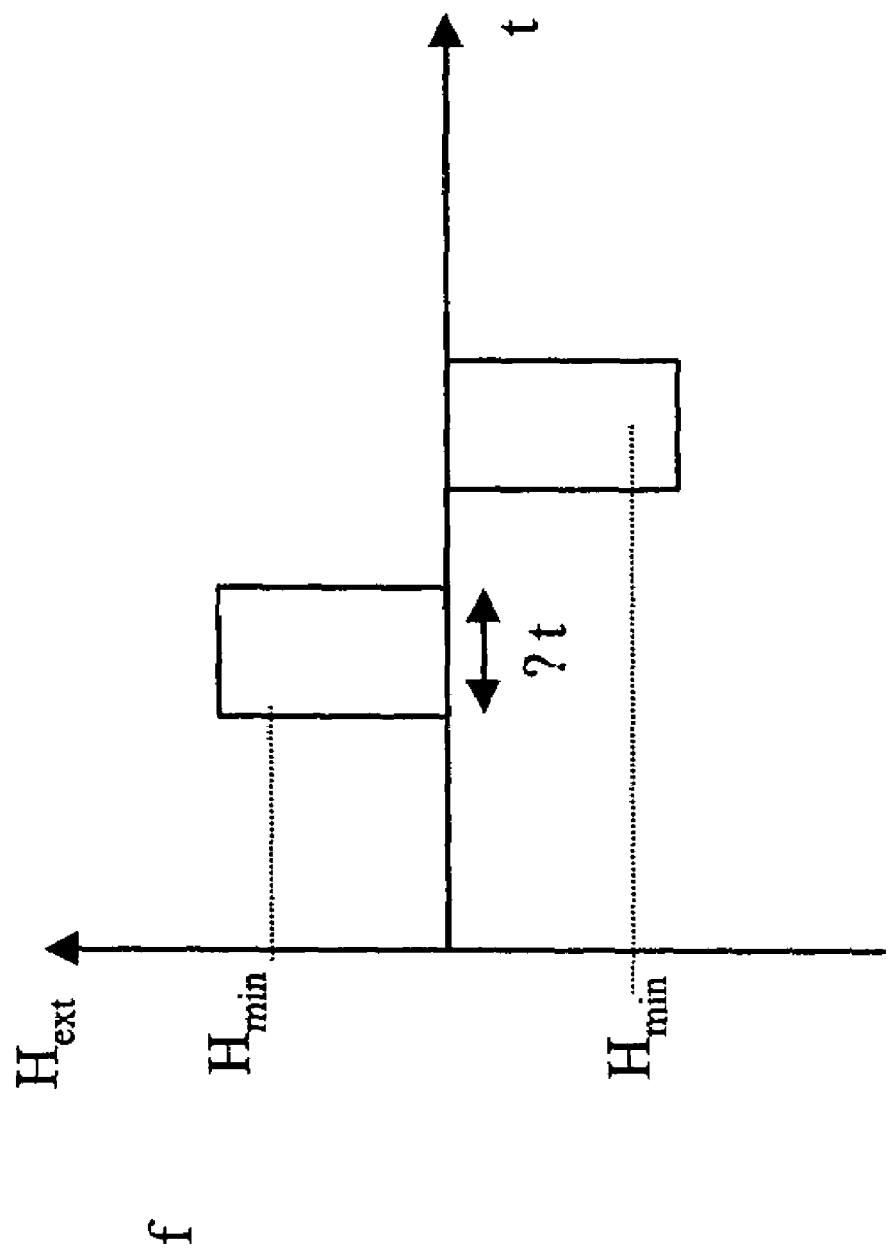
FIG. 2F shows an example of an input signal.

FIG. 2F gives an example of such an external magnetic field. A pulse is applied resulting in a magnetic field $H_{ext}$ of a first sign above a minimal level $H_{min}$ required to program the quantum bit with one quantum flux. If the quantum ring is to be erased an external magnetic field of an opposite sign is applied.

In a second aspect of the invention the quantum bit structure and its input/output structure are disclosed.

In a first embodiment of the second aspect a quantum bit structure is disclosed. The present invention discloses the design of qbits realized as mesoscopic conducting rings. These objects offer a compromise between the atomic or molecular level and nanostructure level and allows a quantum behavior, yet large enough to be manufactured using semiconductor processing techniques in a reproducible way and to allow for I/O ports. In particular sets of metal rings are considered, including in- and output devices or structures. The quantum-like behavior of the proposed qbit is the quantization of the magnetic flux trapped by the conducting or super-conducting ring as explained above.

Figure 1B:
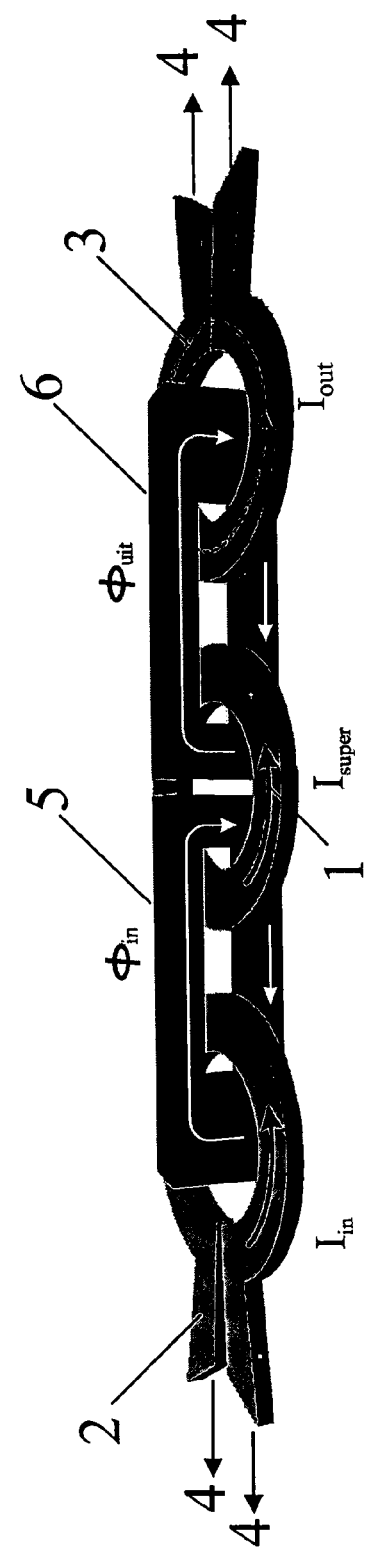
FIG. 1B is a ring system with open input and output elements, magnetically coupled using a ferromagnetic core.

FIG. 1B shows a three-ring structure (1,2,3), wherein the ring structure (1) is the basic element of a quantum computer according to the present invention. The qbit (1) is located in between two semi-closed rings (2,3). These semi-closed rings can be connected to bonding pads (4) which in turn can be connected to the interconnect circuitry of a semiconductor chip or circuit. This semi-closed or open ring thus serves as an in (2)- or output (3) structure and enables an easy access from the external world to the quantum system. Applying an external time-dependent current signal $I_{in}$ to the bonding pads of the input structure (2) of the quantum system would produce a changing magnetic flux $\Phi_{in}$ which can induce, in its turn, a current $I_{super}$ in the "free", isolated closed ring (1) adjacent to and magnetically coupled to this input port (2). The isolated ring (1) is the computational basic element of the quantum system. The current $I_{super}$ generated in the free ring (1) can also induce by a magnetic flux $\Phi_{out}$ a current in a neighboring, magnetically coupled, ring and so on. This neighboring ring can be the output port (3) of the quantum system and the corresponding current $I_{out}$ generated in this output ring (3) can be read out at the bonding pad connected to the output ring (3). The electromagnetic fields generated by the current flowing trough the semi-closed or closed elements (1,2,3) are used as information carrier in the quantum system. The three elements could be of equal size, but the input/output rings might have larger dimensions if needed for connection or heat dissipation purposes without effecting the device operation. The open input (2) and/or the output (3) ring can be conceived as a solenoid. In this case the output signal will be amplified with the number of turns, as is the case in a classical transformer.

Figure 1C:
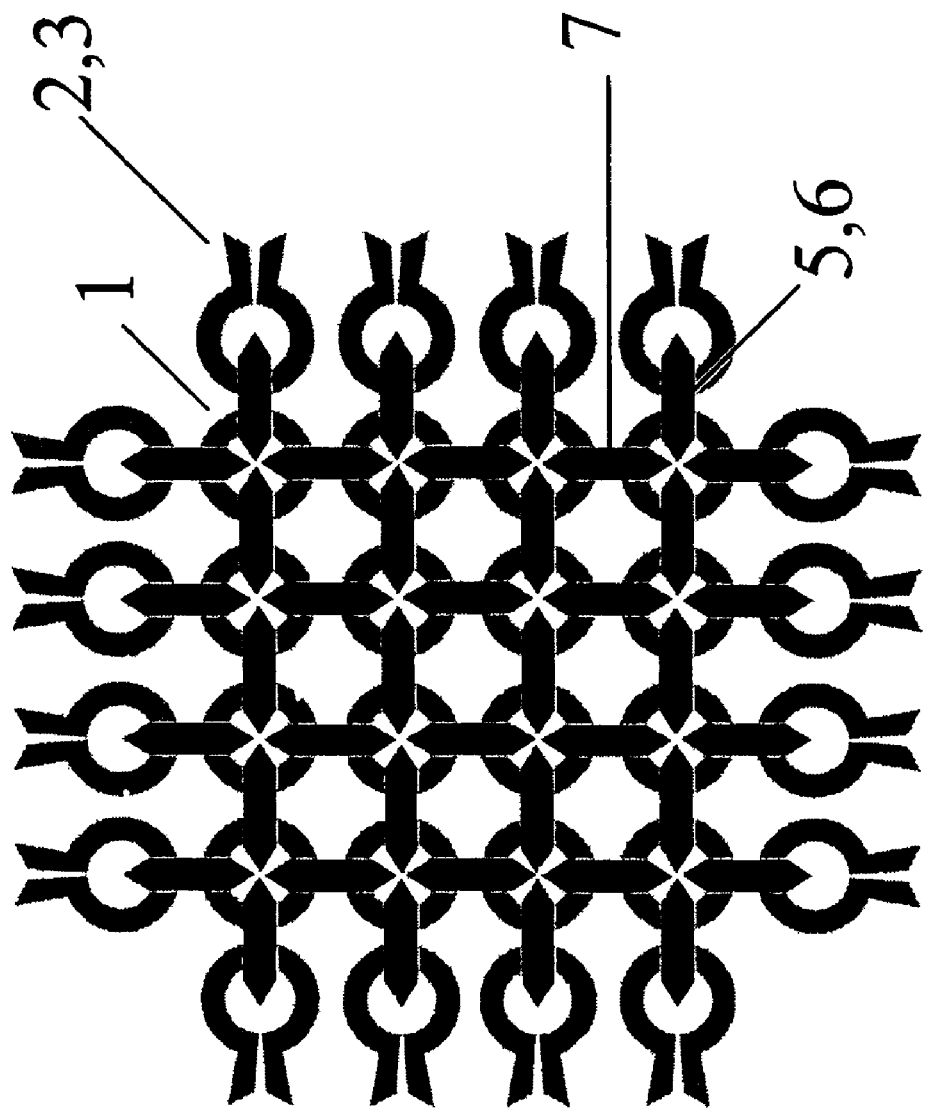
FIG. 1C is a matrix of closed rings and open input and output elements.
Figure 1D:
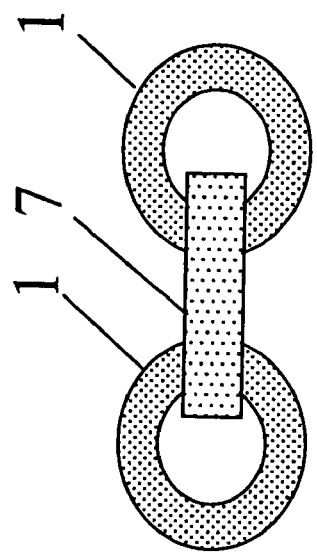
FIGS. 1D, 1E and 1F illustrate alternative embodiments of the computational elements.

FIG. 1C shows a schematic representation of quantum computer according to the present invention comprising a matrix of n by m (both integers) freestanding, electrically isolated qbits (1), which are electro-magnetically coupled, with each other (7) and with (5,6) the I/O (input-output) structures (2,3). As can be seen from this figure the I/O structures (2,3) are on the outer edge of the two-dimensional plane of computational elements (1). The I/O structures (2,3) are interchangeable: the input ring can also be used as an output ring depending on the direction in which the information flows. The operation of such a quantum computer is depending on the computational algorithm used.

Figure 1E:
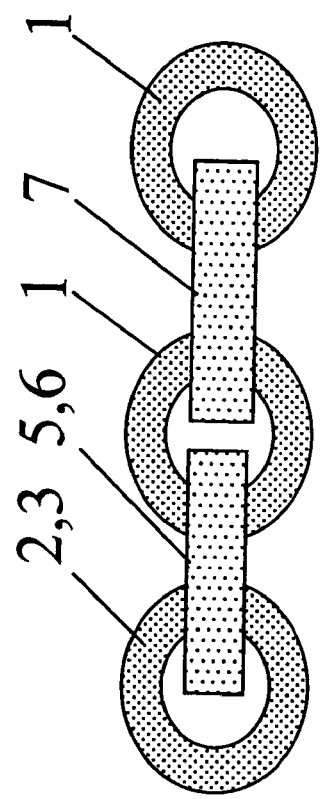
Figure 1F:
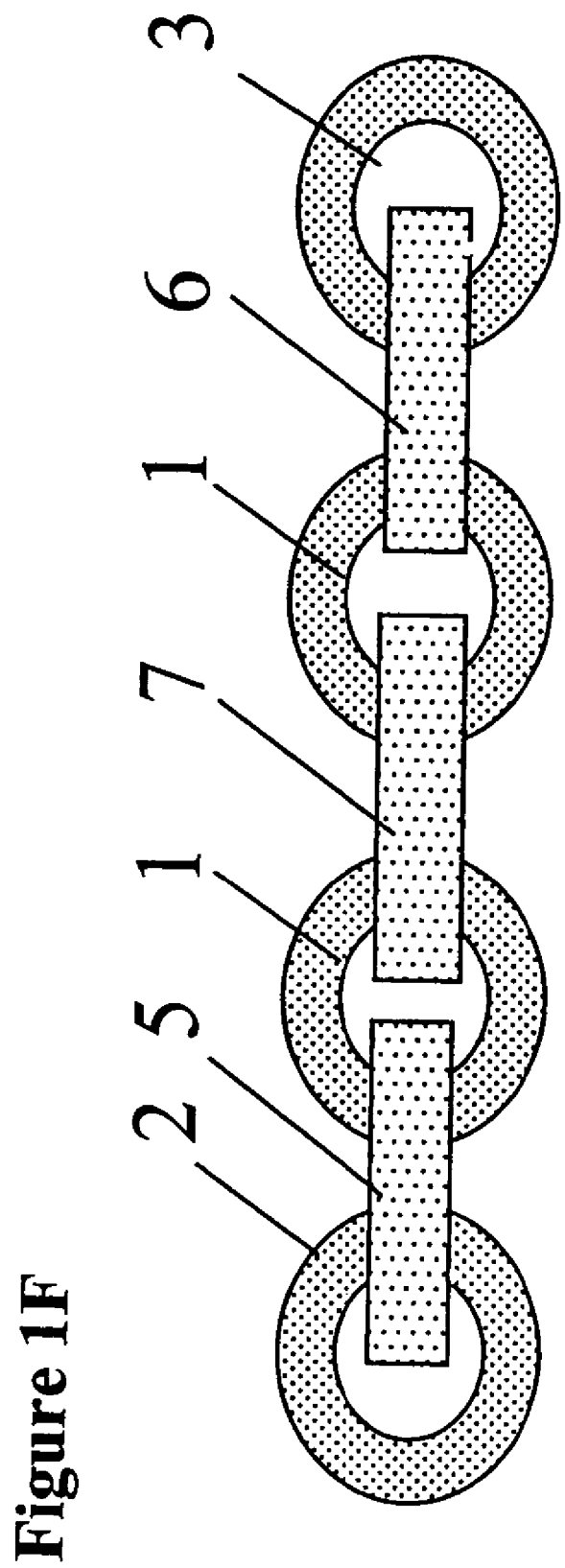

Alternative arrangements are shown in FIGS. 1E to 1F. FIG. 1E shows a basic quantum computer comprising two computational elements (1) of a superconducting material. The two computational elements (1) are magnetically coupled using a ferromagnetic core (7) whereby each computational element (1) is respectively linked with one of the two legs of the core (7). The two qbits (1) can be in entangled state resulting from a quantum-mechanical interaction between the two qbits (1). Both qbits (1) are magnetically accessible: magnetic fields can be induced and applied to the qbits (1) in order to apply the desired flux quantum when programming, these flux quantum will result in a certain amount of persistent current in the qbit (1), or magnetic fields can be sensed when reading the outcome of the computational operation. Inducing and sensing of magnetic fields can be done using superconducting quantum interference devices (SQUID) or by using magnetic force microscopy. FIG. 1E shows the quantum computer of FIG.

1 in which for inducing or for sensing of the magnetic field a semi-closed structure (2,3) is used. This semi-closed structure (2,3) is magnetically coupled to an adjacent computational element (1) using a ferromagnetic core (5,6). A current flowing through this semi-closed structure (2,3) will induce a magnetic field, which will result in a persistent current in the computational element (1). In its turn such a persistent current, more precisely the flux quantum generating this current can induce a current in a adjacent semi-closed structure (2,3) which is magnetically coupled to this computational element (1). FIG. 1F shows the quantum computer of FIG. 1E wherein for inducing (2) as well as for sensing (3) the magnetic fields semi-closed structures (2,3) are used. One semi-closed structure (2) is used as input element to induce a magnetic flux quantum, which is magnetically coupled (5) to an adjacent computational element (1). This computational element (1) is magnetically coupled (7) to another adjacent computational element (1), which in its turn is magnetically coupled (6) to another semi-closed structure (3). This semi-closes structure (3) is used as an output element to sense the induced magnetic field.

In a second embodiment of the second aspect methods and means for improving the magnetic coupling between the elements of the quantum bit device are disclosed. The quantization of the information carried by the magnetic flux as well as the guidance of the magnetic flux between adjacent rings as well as is a feature of the present invention. A larger amount of the magnetic field lines is found to spread out in space and therefore appropriate flux guiding has to be achieved to minimize or cancel information loss, thereby setting the classical basis for the disclosed device. The better the magnetic coupling between the qbits (1) amongst themselves and between the qbits and the I/O structures (2,3), the better the coherence between the individual bits.

Figure 3A:
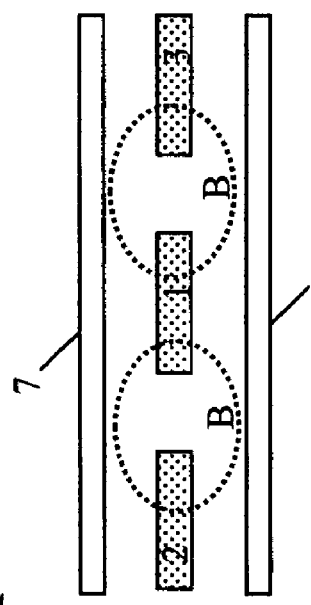
FIG. 3A shows a sandwich of plates and FIG. 3B shows overlapping elements for improving the magnetic coupling between the elements of the quantum system according to the present invention.

FIG. 3A illustrates an embodiment in which the magnetic coupling between the elements of the quantum system is improved by sandwiching the quantum system between two plates (7) of superconducting material. Due to the Meissner effect the magnetic field is confined within the top and bottom plates (7). The dotted lines denotes the magnetic field squeezed due the Meissner effect of superconducting top and bottom plate (7). This way more magnetic field lines will pass through the core of adjacent rings.

Figure 3B:
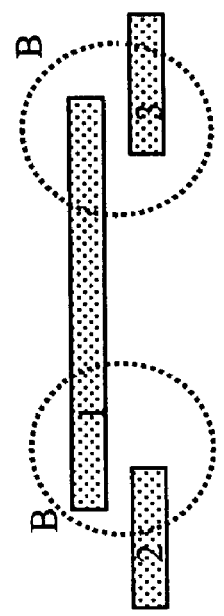

FIG. 3B illustrates an embodiment in which the magnetic coupling is improved by positioning the elements (1,2,3) of the quantum system alternating in different planes and having the rings (1,2,3) partially overlapping each other. In this embodiment the structures (1,2,3) are alternately formed on different planes. Within each plane the structure is positioned so as to at least overlap partially with the structures formed on a plane above or below the plane at which the current structure is positioned. The floating ring (1) shares two cores with the input (2) and output (3) ring. The in- and output rings are situated in a ground plane, whereas the free ring is put in an adjacent level with preferably half of its area above the input port and half of it covering the output port.

FIG. 1B illustrates a preferred embodiment in which the magnetic coupling is improved by including a ferromagnetic core (5,6,7) between the elements (1,2,3) to create a transformer-like structure. Ferromagnetic cores between the rings are used similar to the case of a transformer in macro-scale transformers. These cores should be fully closed and pass through the holes of the elements (1,2,3) without touching them. Preferably a soft permalloy with a high permeability is used, such as Nickel-Iron. As shown in FIG. 1B, the input ring (2) and the qbit (1) are connected by a metal core (5) thereby forming a transformer. The magnetic field lines giving rise to a flux $\Phi_{in}$ are concentrated within this core and the field losses are reduced. As shown in FIG. 1C for a quantum system each element in the array of the qbit cells is connected with its neighboring qbits by a metal core (7) or with an input/output element (2,3) by a metal core (5,6). In this example each qbit (1) shares 4 cores (5,6,7) with its adjacent qbits (1) or with an I/O element (2,3). The cross-sectional area of the core should preferably be as large as possible and constant along the core as this will determine the maximum magnetic inductance B in the core. The vertical part (5b, 6b) of the core should cover as much as possible the area of the ring opening without touching the ring itself. The top (5c, 6c) and bottom parts (5a, 6a) of the core should preferably be as thick as possible.

Note that the input/output elements (2,3) are not coupled with adjacent input/output elements (2,3). These elements (2,3) are in direct electrical contact with the outside world and consequently these elements are generally not in a superconducting state. These elements (2,3) should have a good normal conductivity.

In a third aspect of the invention alternative process sequences are given to manufacture the quantum bit of the present invention in a fashion, compatible with semiconductor or CMOS Processing. An advantage of the invention is that process steps and methods known in semiconductor processing can be used to manufacture the devices. Metal layers can be deposited using e.g. Chemical-Vapour-Deposition (CVD), Physical-Vapour-Deposition (PVD), sputtering techniques, spin-on or electrochemical plating techniques. Dielectric layers can be formed e.g. by CVD, by spin-on depositing techniques. Dielectric layers can be planarized by using chemical-mechanical-polishing (CMP, by etch-back of layers, by coating layers with spin-on-materials. Layers are patterned using lithographic processes in which a pattern is transferred by using e.g. optical, Ultra-Violet or E-beam lithography to a photosensitive layer formed on this layer. This patterned photosensitive layer can then be used to transfer the pattern to the underlying layer(s) and afterwards the photosensitive layer is removed leaving only the patterned layer. This transfer can be done by using wet etching, dry etching or by lift-off techniques. Where appropriate cleaning steps will be performed to deposition steps or after removal steps. Persons skilled in semiconductor process technology know all such steps.

In the light of the above, a person skilled in the art would realize that for ease of processing using state-of-the-art technology all layer or structure heights should preferably be in the range of 50 to 300 nanometer, but less than 5 micrometer.

In a first embodiment of the third aspect a process sequence is disclosed which doesn't require the use of electrochemical deposition processes. The process sequence is illustrated in FIGS. 4A–g, which corresponds to the basic set of 3 elements (1,2,3) shown in FIG. 1B. A person skilled in the art will appreciate that this process sequence can also be used to form a quantum system illustrated in FIG. 1C. For example the parts of core (6) between isolated rings (1) is formed together with their counterparts of the cores (5,6,) connecting the qbits (1) with the I/O rings (2,3).

Figure 4A:
FIG. 4A, FIG. 4B, FIG. 4C, FIG. 4D, FIG. 4E, FIG. 4F, and FIG. 4G are methods for manufacturing a quantum system in accordance with an embodiment of the invention.

First a substrate (10) is provided as shown in FIG. 4A. This substrate can be a semiconductor substrate as used in CMOS processing: silicon, silicon-on-insulator, germanium, gallium-arsenide. The substrate can also be a ceramic or thin-film substrate. The substrate can be a blanket substrate, optionally covered with a dielectric layer, e.g. an oxide. Electronic circuitry might already be present on this substrate, e.g. transistors might already be formed, interconnect levels might be present. Such underlying electronic circuitry is covered with an insulating layer separating the quantum structures from underlying devices or conductors.

Figure 4B:
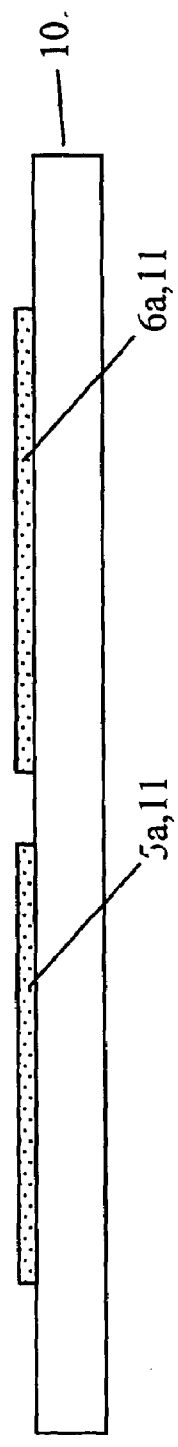

On top of this substrate (10) the bottom part (5a, 6a) of the cores (5,6) is formed. A layer of a first metal (11) is deposited and patterned to form the bottom part of the cores as shown in FIG. 4B. This first metal is made of a magnetic material, preferably a soft permalloy such as NiFe or an alloy thereof. This material, which will be part of the core, should have a high saturation magnetic field and a low hysterisis.

Figure 4C:
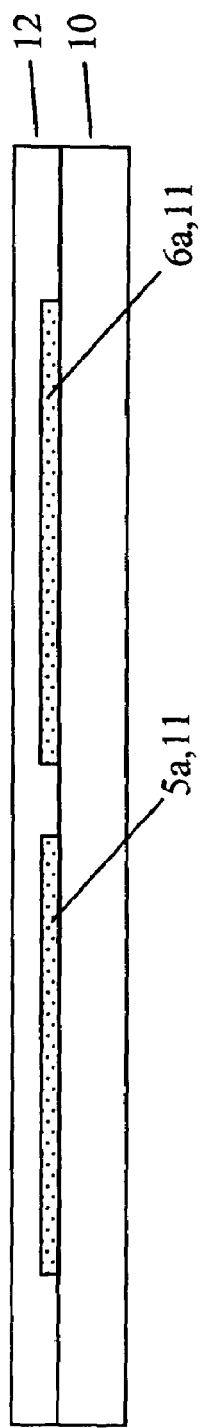

As shown in FIG. 4C the bottom part (5a, 6a) of the cores (5,6) is covered with a first dielectric layer (12), which will form part of the insulation between the cores (5,6) and the rings (1,2,3) of the quantum system. The outer surface of this first dielectric layer (11) should preferably be planar in order to control topographical effects on the rings (1,2,3), which will be formed on this surface. Optionally a planarisation step such as CMP can be applied, in which an initial thicker layer is polished down to the desired layer thickness and planarity. This first dielectric layer can be an oxide or nitride layer.

Figure 4D:
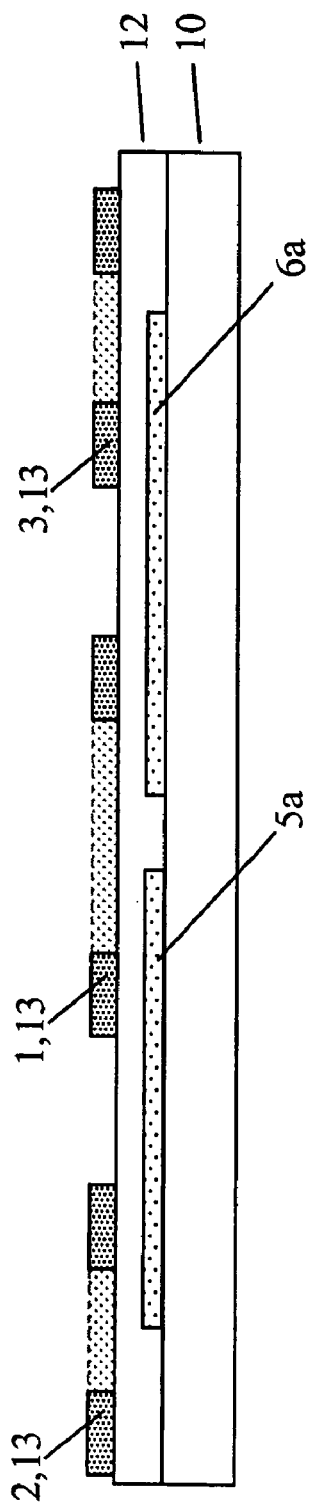
Figure 4E:
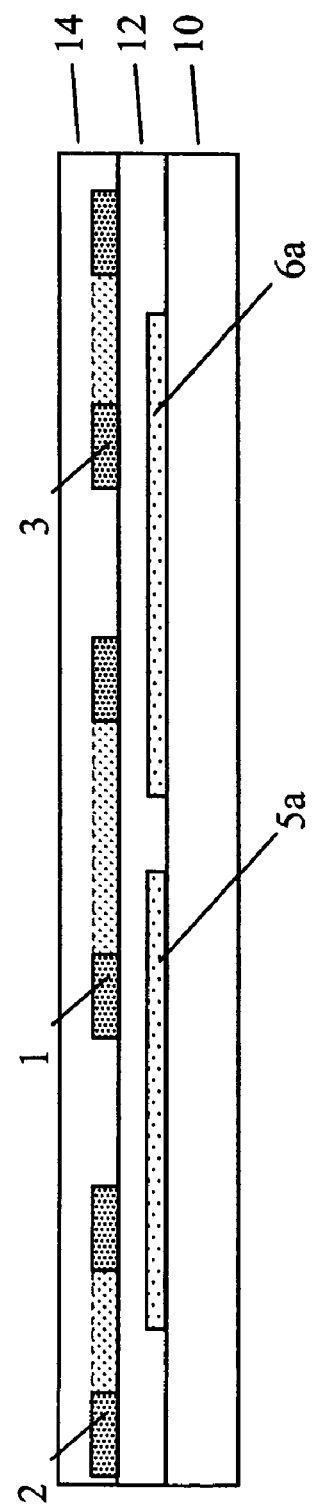

On top of this first dielectric layer (12) the bonding pads (4, not shown), input (2)/outputs (3) elements, the qbits (1) are formed. A second metal layer (13) is deposited on the first dielectric layer (12) and patterned to form respectively the bonding pads (not shown) connected to the input ring (2), the input ring (2), the isolated ring (1), the output ring (3) and the bonding pads (4) connected to the output ring (3). This second metal layer is a layer of a superconductive material such as a metal (Aluminum, Niobium). The ring structures (1,2,3) are patterned such that the bottom part (5a, 6a) of the cores overlaps with the opening of the corresponding rings. The opening of the input (2)/output (3) rings is aligned with the outer end of respectively the bottom parts (5a, 6a), while the opening of the qbit (1) is aligned with the inner ends of both bottom parts (5a, 6a) as shown in FIG. 4D.

As shown in FIG. 4E the substrate is again covered with a dielectric layer (14), which will form part of the insulation between the cores (5,6) and the rings (1,2,3) of the quantum system. The outer surface of this second dielectric layer (14) should preferably be planar in order to control topographical effects rings (1,2,3), which will be formed on this surface. Optionally a planarisation step such as CMP can be applied, in which an initial thicker layer is polished down to the desired layer thickness and planarity. This second dielectric layer can be e.g. an oxide or nitride layer.

Figure 4F:
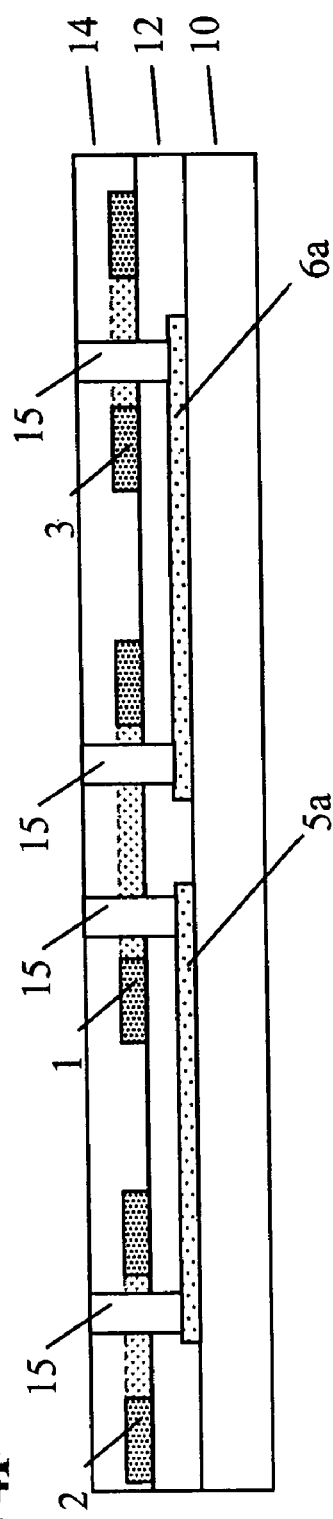

As shown in FIG. 4f openings (15) are formed throughout the first (12) and second (14) dielectric layers to expose the first metal layer (11). These openings (15) are aligned with the openings of the rings (1,2,3) and with the ends of the bottom parts (5a, 6a). The openings (15) can be etched stopping on the first metal layer (11) or on the substrate (10) underneath this first metal layer (11). Optionally a dedicated layer (not shown) can be provided on top of the first metal layer (11) or on top of the substrate (10) to be used as an etch stop layer. Preferably this etch stop layer also is selected from the group of magnetic materials. If a non-magnetic material is used as etch-stop layer, this layer should be removed as to expose the first metal layer (11) at the bottom of the openings (15). These openings will later on be metallised to constitute the uprising or vertical parts (5b, 6b) of the cores (5,6) connecting the bottom (5a, 6a) and top (5b, 6b) parts of the cores (5,6).

Figure 4G:
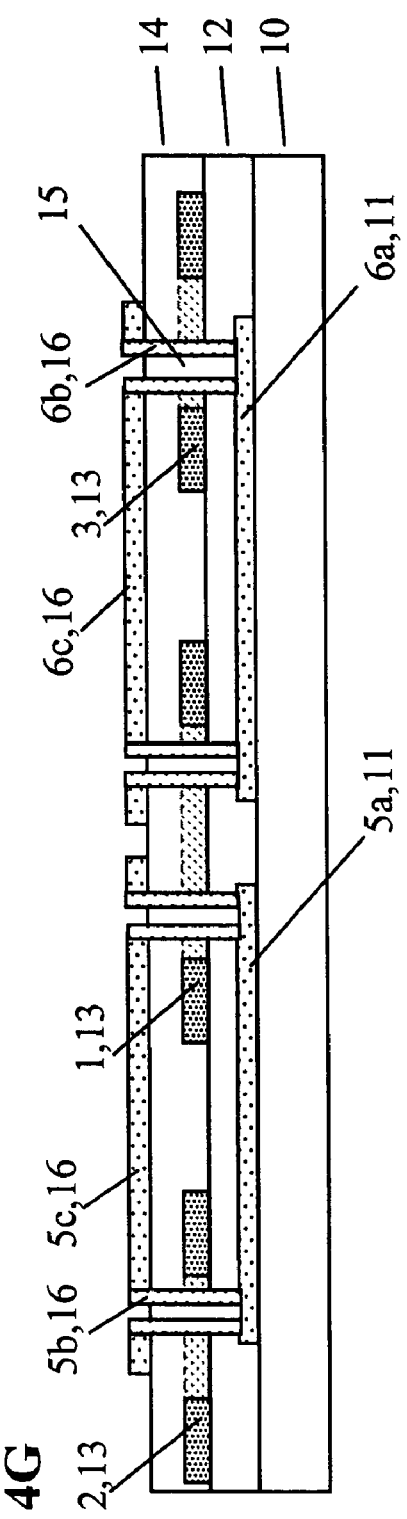

After forming the openings (15) a second metal layer (16) is deposited over the substrate. This second metal layer is patterned to form the top parts (5c, 6c) of the cores (5,6), which overlap the openings (15) whereby the second metal layer (15) covers at least the sidewalls and the bottom of the openings (15) in order to form the vertical parts (5b, 6b) of the cores (5,6) contacting the bottom and the top parts of the cores as shown in FIG. 4g.

Additionally a passivation layer (not shown) can be deposited over the substrate to protect the quantum system. This passivation layer can be e.g. a bilayer of oxide and nitride or a monolayer thereof. Openings are etched in this passivation layer to expose the bonding pads (4, not shown) in order to allow contacting of the quantum system.

In a second embodiment of the third aspect a process sequence is disclosed which uses electrochemical deposition processes, in this example electroplating. The process sequence is illustrated in FIGS. 4A–c, which corresponds to the basic set of 3 elements (1,2,3) shown in FIG. 1B.

Figure 5A:
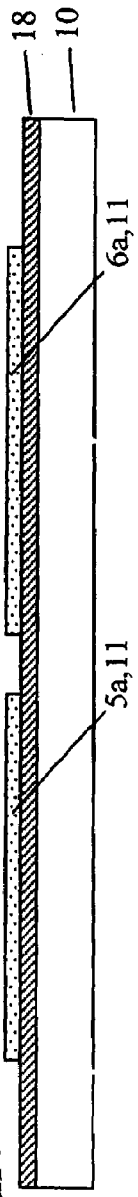
FIG. 5A, FIG. 5B and FIG. 5C are methods for manufacturing a quantum system in accordance with an embodiment of the invention.
Figure 5B:
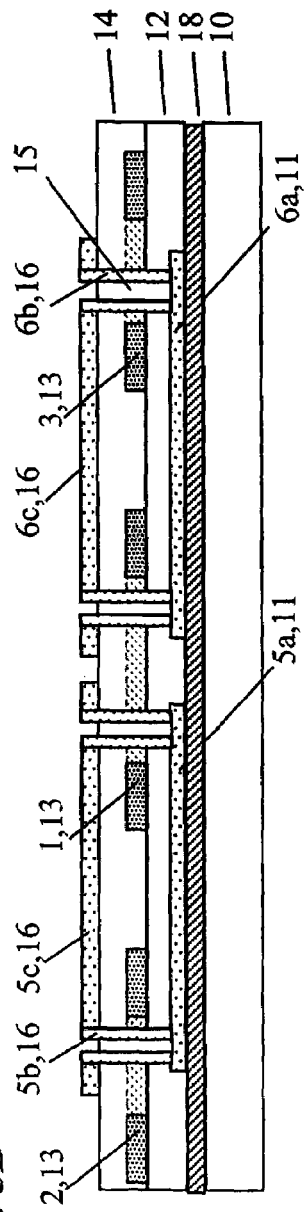

After providing a substrate (10) a conductive layer (18) is deposited as shown in FIG. 5A. This conductive layer (18) will be used during the electroplating process. Preferably this conductive layer (18) is a non-magnetic metal such as Copper or Gold as to prevent leakage of magnetic field lines from the cores (5,6,7) and unwanted coupling of qbits via this common conductive layer (18).

The processing steps of the embodiment illustrated in FIGS. 4A–g are used: formation of the bottom parts of the cores, deposition of a first dielectric layer (12), formation of the bonding pads (4) and rings (1,2,3), deposition of a second dielectric layer (14), opening of the contact holes (15), deposition and patterning of a second metal layer (16) to form the top parts (5c, 6c) of the cores (5,6) overlapping the openings (15) whereby the second metal layer (15) covers at least the sidewalls and the bottom of the openings (15). (see FIG. 5A).

Figure 5C:
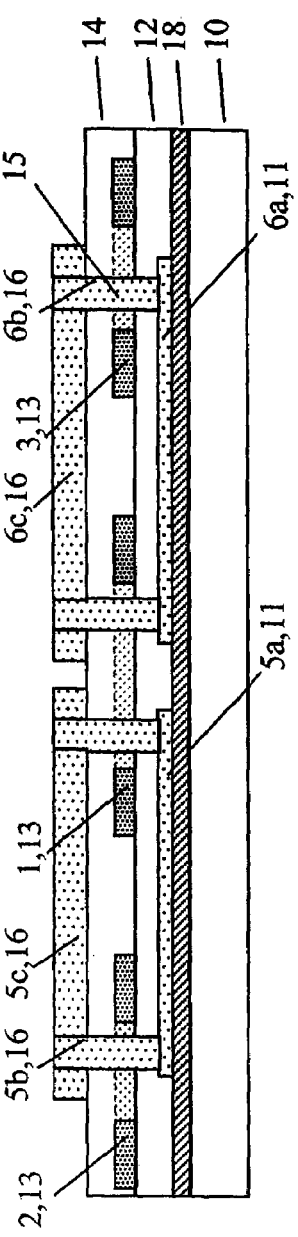

In order to increase the thickness of the core (5,6) an electroplating process is used. During this process the conductive layer (18) is biased and additional magnetic material is deposited on the patterned second metal layer (15) to increase the thickness of the vertical (5b, 6b) and top parts (5c, 6c) of the cores (5,6). (see FIG. 5C). Optionally also the thickness of the bottom parts (5a, 6a) can be increased by an applying an electroplating process to add additional magnetic material to these bottom parts prior to the deposition of the first dielectric layer (12). In yet another option electroplating is used to fill the openings (15) with magnetic material and afterwards the second metal layer (16) is deposited over the substrate. This second metal layer is patterned to form the top parts (5c, 6c) of the cores (5,6), which overlap the already filled openings (15).

Additionally a passivation layer (not shown) can be deposited over the substrate to protect the quantum system. This passivation layer can be e.g. a bilayer of oxide and nitride or a monolayer thereof. Openings are etched in this passivation layer to expose the bonding pads (4) in order to allow contacting of the quantum system.

A preferred embodiment of the invention is disclosed below.

Structures were designed, consisting of basic aluminum ring arrangements (in- (2) and out (3) put rings and computing element (1)) as well as the ferromagnetic cores (5,6,7), made of nickel-iron (NiFe). Aluminum is a type I superconductor and the samples that are used in-house are found to be superconducting for temperatures below 1.23 K. NiFe has a relative permeability of about 75000. The structures are designed for evaluation purposes in such a way that it is possible to perform electrical measurements as well as low temperature measurements using magnetic force microscopy (MFM). These experiments enabled us to verify a transformer-type effect of magnetic coupling and also if the flux quantization effect is compatible with the presence of persistent currents in the ring. The layout is realized, using lithography masks and standard processing techniques, such as deposition, etching and lift-off. In total, four device layers are present, embedded on a substrate, using three masks:

Mask for bottom core-parts (5a, 6a), which is re-used to form the top core parts (5c, 6c)

Mask for rings (1,2,3) and bonding pads

Mask for core-tips (5b, 6b),

The structures are drawn using the Cadence Virtuoso software. They include 15 micrometer diameter rings with thicknesses of 2 micrometer. The cores and tips are designed in such a way that all gaps, separations and minimal distances are 2 micrometer. Optical alignment structures and a passivation layer are included as well. The corresponding optical lithography masks are made in-house. A process-flow is set up, using these masks to build the device on two-inch Si wafers in about twenty processing steps. The crucial step is to connect the top and bottom parts of the cores by making trenches (15) going through the rings, but not touching them. These trenches (15) are needed for the core-tips as to form closed structures. Simulations have supported the idea of using the ferromagnetic cores. 99% of the flux can be guided from an input ring (2) to a free ring (1), and 49% of that flux can be guided to an output ring (3). Two cores (5,6) share the available area on the free ring (1). There is sufficient coupling to get enough flux for creating a persistent current in a superconducting ring (1). The small cores enable us to use low current signals and still achieve relatively high magnetic fields which doesn't exceed the critical field strength of the superconductive material used. In one example a system comprising three rings of 6 micrometer diameter and thickness of 1 micrometer are simulated, using NiFe cores of permeability 75000. An input current of 10 mA in the first ring produced fields up to 0.118 T inside the cores and was sufficient to achieve the desired coupling. A soft permalloy with high permeability will switch its magnetic moments, according to the frequency of the driving signal, and continuously guide the flux from one ring to another. Signals in the range of a few micro-Ampere up to 100 milli-Ampere with frequencies below 100 MHz are sufficient to not exceed the saturation field of the permalloy and also to enable synchronized switching between the core and the magnetic field. The results indicate that using superconducting aluminium rings in combination with the ferromagnetic cores (permalloy NiFe, $\mu\sim75000$) are suitable candidates as quantum bits. Injecting input currents of 1 mA, alike the signal shown in FIG. 2F, up to frequencies of 1–10 MHz produces magnetic fields of around 1 T inside the cores, just below the saturation point of the permalloy (1.1 T). The flux coupling achieved depends on the spatial arrangement of the cores. In order to trap one or multiples of the London flux quantum $\phi_0$, a minimum coupling of 50% is required between the input ring and the floating ring (computing element). The local fluxes are in the order of $10^{-13}$ Wb and an improvement to the free-field case of about two to three times $10^2$ is achieved. The simulations confirmed the feasibility of the qbit architecture and the structures are currently being processed, because the devices under investigation are not only capable of emulating a register of quantum bits but also contain extremely small transformers with permalloy cores to improve the flux guiding.

What is claimed is:

1. A device comprising:
    at least two computational elements, each computational element being shaped as a ring-like structure, wherein each computational element is magnetically coupled to at least one adjacent computational element; and
    an interface structure configured to provide magnetic access to the computational elements.

2. The device of claim 1, wherein said ring-like structure comprises a ring having a single hole therein.

3. The device of claim 1, wherein said computational element is magnetically coupled with the at least one adjacent computational element by sharing the core of a transformer.

4. The device of claim 1, wherein the interface structure comprises at least one input-output element, and wherein each of said input-output elements is magnetically coupled to an adjacent computational element.

5. The device of claim 1, wherein the interface structure comprises:
    at least one input element and at least one output element, said input element and said output element being magnetically coupled to an adjacent computational element.

6. The device of claim 1, wherein said computational elements are positioned in a two-dimensional array, and at least one of the computational elements at a border of this two-dimensional array is coupled to an input element, and wherein at least one of the other computational elements at the border of this two-dimensional array is coupled to an output element.

7. The device of claim 1, wherein each of the at least two computational elements is configured to change its conductive state from superconducting to ohmic conduction in response to a magnetic pulse.

8. The device of claim 1, further comprising a circuit configured to provide a current to the input element, and another circuit configured to receive a current from the output element.

9. The device of claim 1, wherein the ring-like structure is configured as a closed structure to allow a closed current flow therein.

10. The device of claim 1, wherein the computational element comprises a topological space of genus 1.

11. The device of claim 1, wherein the device comprises a quantum computer.

12. The device of claim 1, wherein each of the at least two computational elements comprises a closed-ring structure having a single hole.

13. The device of claim 2, wherein said ring comprises a superconducting material of type I.

14. The device of claim 4, wherein said input-output element is configured as a semi-closed ring.

15. The device of claim 5, wherein each of said input element and output element is magnetically coupled to an adjacent computational element by sharing the core of a transformer.

16. The device of claim 9, wherein the ring-like structure is positioned between the interface structure and another interface structure, and wherein each interface structure comprises a semi-closed ring shaped element.

17. The device of claim 16, wherein one of the semi-closed ring shaped elements operates as in input for receiving a time-dependent current signal, and the other semi-closed ring shaped element operates as an output for outputting a current signal.

18. The device of claim 17, wherein the time-dependent current signal is indicative of information in a quantum system.

19. The device of claim 12, wherein the at least two closed-ring structures are magnetically coupled to compute information.

20. A device comprising,
at least two computational elements, each computational element being shaped as a ring-like structure, wherein each computational element is magnetically coupled to at least one adjacent computational element by sharing the core of a transformer, said core comprising a permalloy; and
an interface structure configured to provide magnetic access to the computational elements.

21. A device comprising:
at least two quantum computational elements, each quantum computational element being shaped as a ring-like structure, wherein each quantum computational element is magnetically coupled to at least one adjacent quantum computational element; and
an interface structure configured to provide magnetic access to the quantum computational elements.

22. The device of claim 21, wherein the ring-like structure comprises a ring having a single hole therein.

23. The device of claim 21, wherein each quantum computational element is magnetically coupled with the at least one adjacent quantum computational element by sharing the core of a transformer.

24. The device of claim 21, wherein the interface structure comprises at least one input-output element, and wherein each of said input-output elements is magnetically coupled to an adjacent quantum computational element.

25. The device of claim 21, wherein the interface structure comprises:
at least one input element and at least one output element, the input element and the output element being magnetically coupled to an adjacent quantum computational element.

26. The device of claim 21, wherein the quantum computational elements are positioned in a two-dimensional array, and at least one of the quantum computational elements at a border of this two-dimensional array is coupled to an input element, and wherein at least one of the other quantum computational elements at the border of this two-dimensional array is coupled to an output element.

27. The device of claim 21, wherein each of the at least two quantum computational elements is configured to change its conductive state from superconducting to ohmic conduction in response to a magnetic pulse.

28. The device of claim 21, further comprising a circuit configured to provide a current to the input element, and another circuit configured to receive a current from the output element.

29. The device of claim 21, wherein the ring-like structure is configured as a closed structure to allow a closed current flow therein.

30. The device of claim 21, wherein the quantum computational element comprises a topological space of genus 1.

31. The device of claim 21, wherein the device comprises a quantum computer.

32. The device of claim 21, wherein each of the at least two quantum computational elements comprises a closed-ring structure having a single hole.

33. The device of claim 22, wherein the ring comprises a superconducting material of type I.

34. The device of claim 23, wherein the core comprises a permalloy.

35. The device of claim 24, wherein the input-output element is configured as a semi-closed ring.

36. The device of claim 25, wherein each input element and output element is magnetically coupled to an adjacent quantum computational element by sharing the core of a transformer.

37. The device of claim 29, wherein the ring-like structure is positioned between the interface structure and another interface structure, and wherein each interface structure comprises a semi-closed ring shaped element.

38. The device of claim 37, wherein one of the semi-closed ring shaped elements operates as in input for receiving a time-dependent current signal, and the other semi-closed ring shaped element operates as an output for outputting a current signal.

39. The device of claim 38, wherein the time-dependent current signal is indicative of information in a quantum system.

40. The device of claim 32, wherein the at least two closed-ring structures are magnetically coupled to compute information.

\* \* \* \* \*